US012677516B2

(12) United States Patent
Oh et al.

(10) Patent No.: US 12,677,516 B2
(45) Date of Patent: Jul. 7, 2026

(54) DISPLAY DEVICE INCLUDING SELF-ALIGNED LEDS AND METHOD FOR MANUFACTURING DISPLAY DEVICE

(71) Applicant: LG Display Co., Ltd., Seoul (KR)

(72) Inventors: Kum Mi Oh, Paju-si (KR); Deuk Ho Yeon, Paju-si (KR); Sun Wook Ko, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 326 days.

(21) Appl. No.: 18/032,276

(22) PCT Filed: Oct. 19, 2021

(86) PCT No.: PCT/KR2021/014615
§ 371 (c)(1),
(2) Date: Apr. 17, 2023

(87) PCT Pub. No.: WO2022/145657
PCT Pub. Date: Jul. 7, 2022

(65) Prior Publication Data
US 2023/0395767 A1     Dec. 7, 2023

(30) Foreign Application Priority Data

Dec. 30, 2020     (KR) ........................ 10-2020-0187225

(51) Int. Cl.
*H01L 25/00*          (2006.01)
*G06F 3/041*          (2006.01)
(Continued)

(52) U.S. Cl.
CPC ......... *H10H 20/857* (2025.01); *G06F 3/0412* (2013.01); *G06F 3/04164* (2019.05);
(Continued)

(58) Field of Classification Search
CPC .. H01L 25/0753; H01L 25/167; G06F 3/0446
See application file for complete search history.

(56) References Cited

U.S. PATENT DOCUMENTS

| 2017/0269749 A1 | 9/2017 | Bok et al. |
| 2018/0198018 A1 | 7/2018 | Kim et al. |

(Continued)

FOREIGN PATENT DOCUMENTS

| KR | 10-2014-0039470 | 4/2014 |
| KR | 10-2017-0109718 | 10/2017 |

(Continued)

OTHER PUBLICATIONS

International Search Report and Written Opinion dated Jan. 24, 2022, issued in corresponding International Patent Application No. PCT/KR2021/014615.

(Continued)

*Primary Examiner* — Reema Patel
(74) *Attorney, Agent, or Firm* — Morgan, Lewis & Bockius LLP

(57) ABSTRACT

A display device includes a substrate including a plurality of sub-pixels, a plurality of thin film transistors disposed on the substrate, a planarization layer disposed on the plurality of thin film transistors, a plurality of first electrodes disposed on the planarization layer and electrically connected to the plurality of thin film transistors, a plurality of second electrodes disposed on the planarization layer and spaced apart from the plurality of first electrodes, a bank covering a part of each of the plurality of first electrodes and the plurality of second electrodes and disposed to define an emission area, a plurality of LEDs disposed in the emission area and electrically connected to the plurality of first electrodes and the plurality of second electrodes and a plurality of first
(Continued)

conductive patterns disposed on the bank. Therefore, self-alignment of the LEDs can be easily achieved.

11 Claims, 11 Drawing Sheets

(51) Int. Cl.
  *G06F 3/044* (2006.01)
  *H01L 25/16* (2023.01)
  *H10H 20/857* (2025.01)

(52) U.S. Cl.
  CPC .......... *G06F 3/0446* (2019.05); *H01L 25/167* (2013.01); *G06F 2203/04103* (2013.01)

(56) References Cited

U.S. PATENT DOCUMENTS

| | | | |
|---|---|---|---|
| 2019/0074339 A1 | 3/2019 | Ma et al. | |
| 2020/0393936 A1 | 12/2020 | Bok et al. | |
| 2021/0242380 A1* | 8/2021 | Kim | H10H 20/833 |
| 2021/0305222 A1* | 9/2021 | Min | H10H 20/857 |
| 2025/0098371 A1 | 3/2025 | Moon et al. | |

FOREIGN PATENT DOCUMENTS

| | | | |
|---|---|---|---|
| KR | 10-2018-0082667 | 7/2018 | |
| KR | 10-2020-006209 | 1/2020 | |
| KR | 10-2020-0032678 | 3/2020 | |
| KR | 10-2020-0143628 | 12/2020 | |
| WO | 2018051487 A1 | 3/2018 | |
| WO | WO-2019208880 A1 * | 10/2019 | H10D 86/451 |
| WO | WO-2020013403 A1 * | 1/2020 | H10D 86/60 |
| WO | 2020213832 A1 | 10/2020 | |

OTHER PUBLICATIONS

Notice of Allowance dated Nov. 11, 2025, issued in corresponding Korean Patent Application No. 10-2020-0187225 (with a partial English translation). (Note—KR 10-2014-0039470 A, KR 10-2018-0082667 A, and KR 10-2020-0006209 A cited in this KR Notice of Allowance have already been cited in a previously filed IDS.).
DPMA Office Action dated Jul. 29, 2025 issued in counterpart DE Application No. 11 2021 006 707.9.

* cited by examiner

DISPLAY DEVICE INCLUDING SELF-ALIGNED LEDS AND METHOD FOR MANUFACTURING DISPLAY DEVICE

TECHNICAL FIELD

The present disclosure relates to a display device, and more particularly, to a display device in which LEDs may be easily self-aligned and a manufacturing method of the display device.

BACKGROUND ART

As it enters the information era, a display device field which visually displays an electrical information signal is rapidly developing. Thus, research is being conducted on various display devices that are thin and light, and have low power consumption.

Specifically, flat panel display devices, such as a liquid crystal display device using light emitting diodes as a light source and an organic light emitting diode display device using self-emitting OLEDs, are attracting much attention as next-generation display device due to their thin thickness and low power consumption.

DISCLOSURE

Technical Problem

An object to be achieved by the present disclosure is to provide a display device in which LEDs may be easily self-aligned using a conductive pattern and a manufacturing method of the display device.

Another object to be achieved by the present disclosure is to provide a display device in which a conductive pattern used to facilitate self-alignment of LEDs is implemented with a touch electrode and a manufacturing method of the display device.

Objects of the present disclosure are not limited to the above-mentioned objects, and other objects, which are not mentioned above, can be clearly understood by those skilled in the art from the following descriptions.

Technical Solution

According to an aspect of the present disclosure, the display device includes a substrate including a plurality of sub-pixels, a plurality of thin film transistors disposed on the substrate, a planarization layer disposed on the plurality of thin film transistors, a plurality of first electrodes disposed on the planarization layer and electrically connected to the plurality of thin film transistors, a plurality of second electrodes disposed on the planarization layer and spaced apart from the plurality of first electrodes, a bank covering a part of each of the plurality of first electrodes and the plurality of second electrodes and disposed to define an emission area, a plurality of LEDs disposed in the emission area and electrically connected to the plurality of first electrodes and the plurality of second electrodes and a plurality of first conductive patterns disposed on the bank.

According to another aspect of the present disclosure, the manufacturing method of a display device includes a process of preparing a substrate including a plurality of thin film transistors disposed in a plurality of sub-pixels, respectively, a process of forming a planarization layer on the plurality of thin film transistors, a process of preparing a plurality of first electrodes and a plurality of second electrodes spaced apart from each other on the planarization layer, a process of preparing a bank covering a part of each of the plurality of first electrodes and the plurality of second electrodes and disposed to define an emission area, a process of preparing a plurality of first conductive patterns on the bank and a process of facilitating self-alignment of a plurality of LEDs by applying a voltage to the plurality of first conductive patterns.

Other detailed matters of the exemplary embodiments are included in the detailed description and the drawings.

Advantageous Effects

According to the present disclosure, LEDs can be self-aligned by applying a voltage to a plurality of conductive patterns disposed on a bank. Thus, it is possible to simplify a process of disposing the LEDs on a substrate and reduce cost.

According to the present disclosure, a touch sensing part can be configured by disposing additional conductive patterns together with the conductive patterns used to facilitate self-alignment of the LEDs.

The effects according to the present disclosure are not limited to the contents exemplified above, and more various effects are included in the present specification.

MODES OF THE INVENTION

Figure 1:
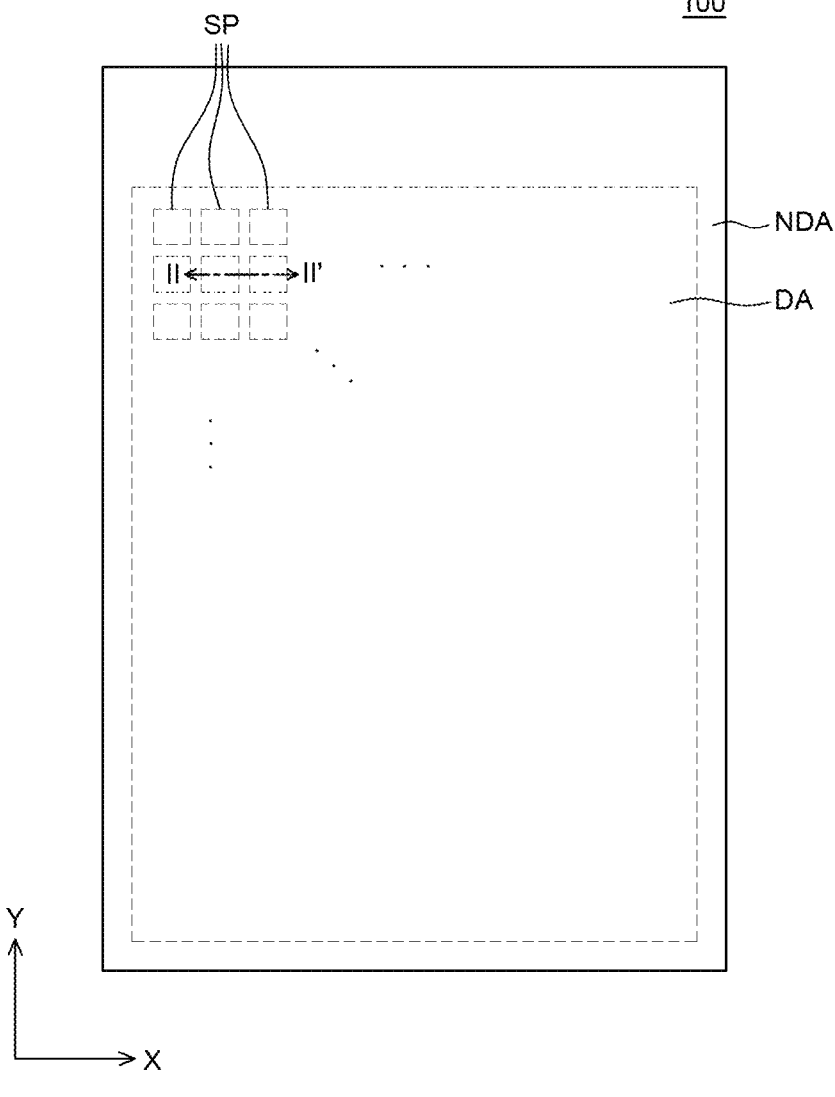
FIG. 1 is a plan view of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, it may be directly on the another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device and a manufacturing method of a display device according to exemplary embodiments of the present disclosure will be described in detail with reference to accompanying drawings.

FIG. 1 is a plan view of a display device according to an exemplary embodiment of the present disclosure.

Referring to FIG. 1, a display device 100 according to an exemplary embodiment of the present disclosure includes a display area DA and a non-display area NDA. In the display area DA, a plurality of pixels is disposed and images are displayed. In the display area DA, pixels including an emission area for displaying images and driving circuits for driving the pixels may be disposed. The non-display area NDA surrounds the display area DA. In the non-display area NDA, images are not displayed, and various lines, driver ICs, printed circuit boards, and the like for driving the pixels and driving circuits disposed in the display area DA are disposed. For example, in the non-display area NDA, various ICs, such as a gate driver IC and a data driver IC, VSS lines, and the like may be disposed.

The plurality of pixels is disposed in a matrix form, and each of the plurality of pixels includes a plurality of sub-pixels SP. Each sub-pixel SP is an element for displaying a single color, and includes an emission area from which light is emitted, and a non-emission area from which no light is emitted. However, in the present disclosure, only the emission area from which light is emitted is defined as the sub-pixel SP.

The plurality of sub-pixels SP may include a first sub-pixel, a second sub-pixel and a third sub-pixel, but is not limited thereto. For example, the first sub-pixel, the second sub-pixel and the third sub-pixel may be repeatedly disposed in an alternate manner in a first direction (X-axis direction). As another example, the first sub-pixel, the second sub-pixel and the third sub-pixel may be alternately disposed in a zigzag pattern in the first direction. In this case, the first sub-pixel and the third sub-pixel may be disposed in the first direction (X-axis direction). Also, the second sub-pixel may be disposed in the first direction so as to be spaced apart from the first sub-pixel and the third sub-pixel in a second direction (Y-axis direction). However, the present disclosure is not limited thereto.

Each of the plurality of sub-pixels SP may be any one of a red sub-pixel, a green sub-pixel, a blue sub-pixel and a white sub-pixel. For example, the first sub-pixel may be a red sub-pixel, the second sub-pixel may be a green sub-pixel and the third sub-pixel may be a blue sub-pixel. Hereinafter, the display device 100 according to an exemplary embodiment of the present disclosure will be described on the assumption that the first sub-pixel is a red sub-pixel, the second sub-pixel is a green sub-pixel and the third sub-pixel is a blue sub-pixel. Although the colors of the respective sub-pixels are illustrated for the convenience of description, the present disclosure is not limited thereto. The colors and placement of the respective sub-pixels SP may be variously changed as necessary.

Figure 2:
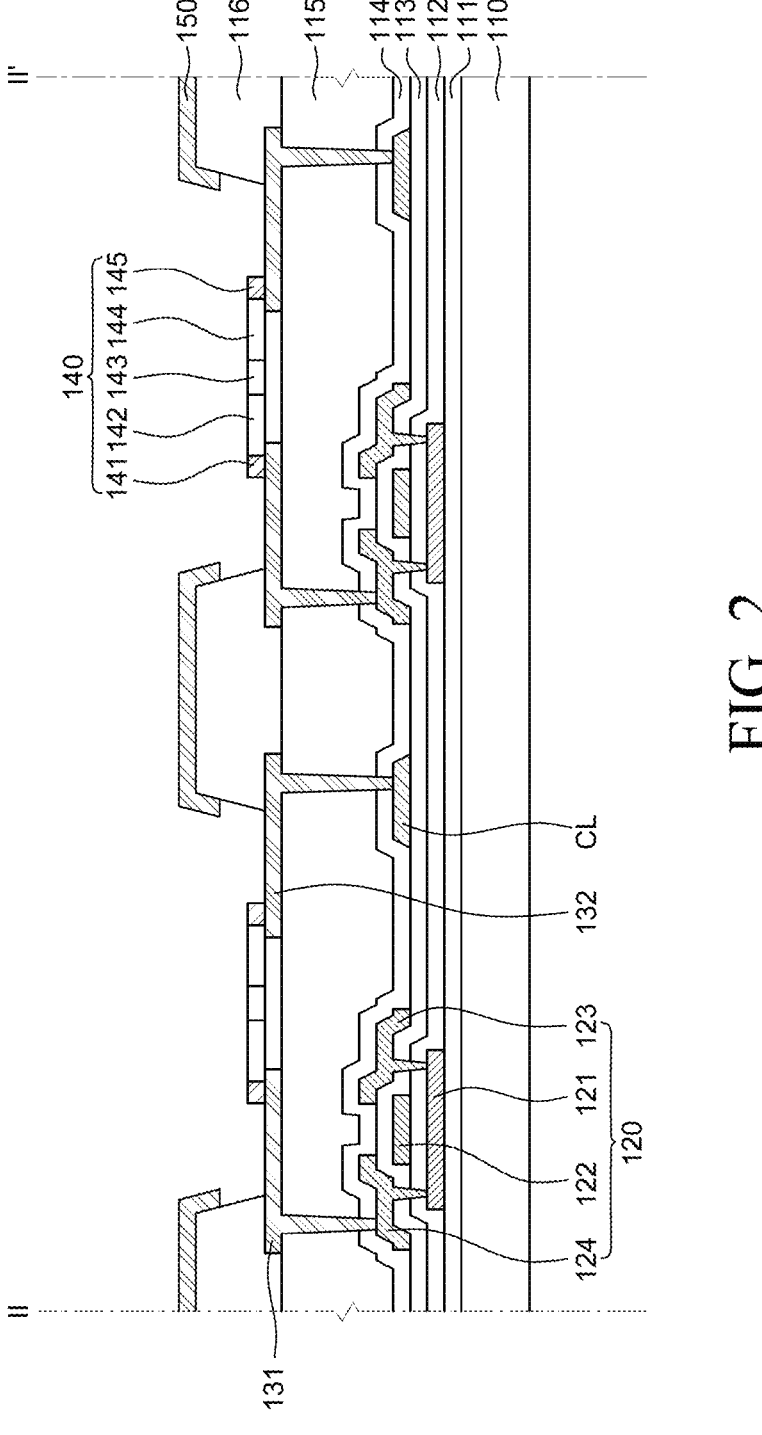
FIG. 2 is a cross-sectional view of the display device as taken along a line II-II' of FIG. 1.

FIG. 2 is a cross-sectional view of the display device as taken along a line II-II' of FIG. 1.

Referring to FIG. 2, the substrate 110 is a support member for supporting other components of the display device 100 and may be made of an insulating material. For example, the substrate 110 may be formed of glass, resin, or the like. Further, the substrate 110 may contain plastic, such as polymer or polyimide (PI), or may be made of a material having flexibility.

A buffer layer 111 is disposed on the substrate 110. The buffer layer 111 may suppress permeation of moisture or impurity through the substrate 110. The buffer layer 111 may be formed into, for example, a single-layered structure of silicon oxide (SiOx) or silicon nitride (SiNx) or a multi-layered structure of SiOx and SiNx, but is not limited thereto. However, the buffer layer 111 may or may not be formed based on the type of the substrate 110 or the type of a thin film transistor 120, but is not limited thereto.

The transistor 120 is disposed on the buffer layer 111. The transistor 120 includes an active layer 121, a gate electrode 122, a source electrode 123 and a drain electrode 124.

The active layer 121 is disposed on the buffer layer 111. The active layer 121 may be made of a semiconductor material, such as an oxide semiconductor, amorphous silicon or polysilicon, but is not limited thereto. For example, when the active layer 121 is made of an oxide semiconductor, the active layer 121 is composed of a channel region, a source region and a drain region. Each of the source region and the drain region may be a conductive region, but is not limited thereto.

A gate insulating layer 112 is disposed on the active layer 121. The gate insulating layer 112 is an insulating layer for insulating the active layer 121 from the gate electrode 122. The gate insulating layer 112 may be formed into, for example, a single-layered structure of silicon oxide (SiOx) or silicon nitride (SiNx) or a multi-layered structure of SiOx and SiNx, but is not limited thereto.

The gate electrode 122 is disposed on the gate insulating layer 112. The gate electrode 122 may be made of a conductive material, such as copper (Cu), aluminum (Al), molybdenum (Mo), nickel (Ni), titanium (Ti), chromium (Cr) or an alloy thereof, but is not limited thereto.

An interlayer insulating layer 113 is disposed on the gate electrode 122. The interlayer insulating layer 113 may include a contact hole for connecting each of the source electrode 123 and the drain electrode 124 to the active layer 121. The interlayer insulating layer 113 may be formed into, for example, a single-layered structure of silicon oxide (SiOx) or silicon nitride (SiNx) or a multi-layered structure of SiOx and SiNx, but is not limited thereto.

The source electrode 123 and the drain electrode 124 are disposed on the interlayer insulating layer 113. The source electrode 123 and the drain electrode 124 are spaced apart from each other so as to be electrically connected to the active layer 121. The source electrode 123 and the drain electrode 124 may be made of a conductive material, such as copper (Cu), aluminum (Al), molybdenum (Mo), nickel (Ni), titanium (Ti), chromium (Cr) or an alloy thereof, but are not limited thereto.

A common line CL is disposed on the interlayer insulating layer 113. The common line CL may be a line for transmitting a common voltage to a second electrode 132. Like the source electrode 123 and the drain electrode 124, the common line CL may be made of copper (Cu), aluminum (Al), molybdenum (Mo), nickel (Ni), titanium (Ti), chromium (Cr) or an alloy thereof, but is not limited thereto.

A passivation layer 114 is disposed on the source electrode 123, the drain electrode 124 and the common line CL. The passivation layer 114 may protect the source electrode 123, the drain electrode 124 and the common line CL. The passivation layer 114 may be formed into, for example, a single-layered structure of silicon oxide (SiOx) or silicon nitride (SiNx) or a multi-layered structure of SiOx and SiNx, but is not limited thereto.

A planarization layer 115 is disposed on the passivation layer 114. The planarization layer 115 is an insulating layer for planarizing an upper part of the substrate 110. The planarization layer 115 may be made of an organic material. For example, the planarization layer 115 may be formed into, for example, a single-layered structure of polyimide or photo acryl or a multi-layered structure of polyimide and photo acryl, but is not limited thereto.

A first electrode 131, a second electrode 132 and a bank 116 are disposed on the planarization layer 115.

The first electrode 131 is electrically connected to the drain electrode 124 through a first contact hole formed in the passivation layer 114 and the planarization layer 115 and exposing a part of the drain electrode 124. Thus, the first electrode 131 may receive a data voltage transmitted through a data line when the thin film transistor 120 is turned on.

The second electrode 132 is disposed on the same plane as the first electrode 131 so as to be spaced apart from each other. The second electrode 132 is electrically connected to the common line CL through a second contact hole formed in the gate insulating layer 112, the passivation layer 114 and the planarization layer 115 and exposing a part of the common line CL. Thus, the second electrode 132 may receive a common voltage transmitted through the common line CL.

The first electrode 131 and the second electrode 132 may be made of a conductive material. For example, the first electrode 131 and the second electrode 132 may be made of a metallic material or a transparent conductive material.

A plurality of LEDs 140 may be connected to the first electrode 131 and the second electrode 132 and may emit light having a wavelength corresponding to each sub-pixel SP. For example, the plurality of LEDs 140 disposed in the first sub-pixel may emit blue light, and the plurality of LEDs 140 disposed in the second sub-pixel may emit green light. Also, the plurality of LEDs 140 disposed in the third sub-pixel may emit red light, but the present disclosure is not limited thereto.

Each LED 140 includes a first device electrode 141, a first conductive semiconductor layer 142, an active layer 143, a second conductive semiconductor layer 144 and a second device electrode 145.

Referring to FIG. 2, each LED 140 is disposed between the first electrode 131 and the second electrode 132. The LED 140 may include the first device electrode 141, the first conductive semiconductor layer 142, the active layer 143, the second conductive semiconductor layer 144 and the second device electrode 145. The first device electrode 141 may be disposed on one end of the first electrode 131 so as to be in contact with the first electrode 131. The second device electrode 145 may be disposed on one end of the second electrode 132 so as to be in contact with the second electrode 132. Thus, a data voltage and a common voltage are applied to the LED 140 so that the active layer 143 may emit light. The first device electrode 141 and the second device electrode 145 of the LED 140 are illustrated as disposed on one end of the first electrode 131 and one end of the second electrode 132 so as to be in contact with the first electrode 131 and the second electrode 132, respectively. However, the present disclosure is not limited thereto. For example, the LED 140 may be disposed on the planarization layer 115 so as to be in contact with ends of the first electrode 131 and the second electrode 132. The structure of the LED 140 will be described in detail later.

The bank 116 is an insulating layer for defining an emission area and is formed on the planarization layer 115. The bank 116 may be made of an organic insulating material, and may be made of the same material as the planarization layer 115. Alternatively, the bank 116 may contain a black material and absorb light in order to suppress color mixing which occurs when light emitted from the LED 140 is transmitted to the adjacent sub-pixel SP. Here, the bank 116 may be optionally disposed as necessary, or may be omitted.

The bank 116 covers a part of each of a plurality of first electrodes 131 and a plurality of second electrodes 132. Specifically, any one of both ends of the bank 116 may be disposed on the other end of the first electrode 131 so as to be in contact with the first electrode 131. Also, the other end of the bank 116 may be disposed on the other end of the second electrode 132 so as to be in contact with the second electrode 132. The bank 116 is disposed to be spaced apart from the LED 140. Here, each of a central portion of the first electrode 131 and a central portion of the second electrode 132 overlaps a separation space between the bank 116 and the LED 140.

A plurality of first conductive patterns 150 may be formed on the bank 116. The plurality of first conductive patterns 150 is formed as extended in the first direction (X-axis direction).

The plurality of first conductive patterns 150 may be formed as transparent electrodes. For example, the plurality of first conductive patterns 150 may be made of a transparent conductive oxide, such as indium tin oxide (ITO), indium zinc oxide (IZO) or zinc oxide (ZO), carbon nanotube (CNT), graphene silver nanowire, or the like, but is not limited thereto.

The plurality of first conductive patterns 150 may facilitate self-alignment of the plurality of LEDs 140. Specifically, when different voltages are respectively applied to odd-numbered first conductive patterns 150 and even-numbered first conductive patterns 150 of the plurality of first conductive patterns 150, the plurality of LEDs 140 may be self-aligned. More details will be described with reference to FIG. 6A through FIG. 6F.

Figure 3:
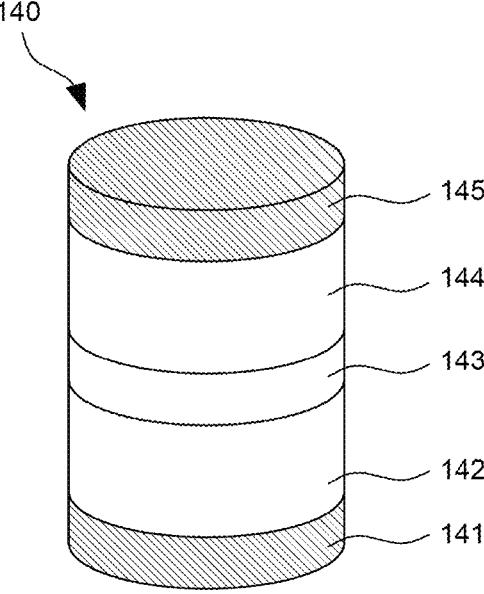
FIG. 3 is a perspective view of an LED of the display device according to an exemplary embodiment of the present disclosure.

FIG. 3 is a perspective view of an LED of the display device according to an exemplary embodiment of the present disclosure.

Referring to FIG. 3, the LED 140 may be a light emitting nanorod having a cylindrical shape, but is not limited thereto. The LED 140 includes the first device electrode 141, the first conductive semiconductor layer 142, the active layer 143, the second conductive semiconductor layer 144 and the second device electrode 145.

The first device electrode 141 may supply holes to the active layer 143. The first device electrode 141 may be made of molybdenum (Mo), aluminum (Al), chromium (Cr), gold (Au), silver (Ag), titanium (Ti), nickel (Ni), neodymium (Nd) and copper (Cu), or an alloy thereof. Alternatively, the first device electrode 141 may be made of a transparent conductive material such as indium tin oxide (ITO) or indium zinc oxide (IZO), but is not limited thereto.

The first conductive semiconductor layer 142 is disposed on the first device electrode 141. The first conductive semiconductor layer 142 may be a p-type semiconductor layer containing a semiconductor material of Group III-V. Specifically, the first conductive semiconductor layer 142 may contain a semiconductor material having an empirical formula of $In_xAl_yGa_{1-x-y}N$ ($0 \leq x \leq 1$, $0 \leq y \leq 1$, $0 \leq x+y \leq 1$). For example, the first conductive semiconductor layer 142 may contain any one of InAlGaN, GaN, AlGaN, InGaN, AlN and InN, and may be doped with a first conductive dopant, for example, magnesium (Mg), etc.

The active layer 143 is disposed on the first conductive semiconductor layer 142. The active layer 143 is a layer for emitting light of a specific color, and may include one of a red active layer, a green active layer and a blue active layer. The active layer 143 may emit light by electron-hole pairs when an electric field is applied thereto. The active layer 143 may have a single quantum well structure or a multi quantum well structure. The active layer 143 may contain a semiconductor material of Group III-V.

The second conductive semiconductor layer 144 is disposed on the active layer 143. The second conductive semiconductor layer 144 may be an n-type semiconductor layer containing a semiconductor material of Group III-V. Specifically, the second conductive semiconductor layer 144 may contain a semiconductor material having an empirical formula of $In_xAl_yGa_{1-x-y}N$ ($0 \leq x \leq 1$, $0 \leq y \leq 1$, $0 \leq x+y \leq 1$). For example, the second conductive semiconductor layer 144 may contain any one of InAlGaN, GaN, AlGaN, InGaN, AlN and InN, and may be doped with a second conductive dopant, for example, silicon (Si), germanium (Ge), tin (Sn), or the like.

The second device electrode 145 may supply electrons to the active layer 143. The second device electrode 145 may be made of molybdenum (Mo), aluminum (Al), chromium (Cr), gold (Au), silver (Ag), titanium (Ti), nickel (Ni), neodymium (Nd) and copper (Cu), or an alloy thereof. Alternatively, the second device electrode 145 may be made of a transparent conductive material such as indium tin oxide (ITO) or indium zinc oxide (IZO), but is not limited thereto.

When a display device including LEDs is manufactured, the LEDs are disposed in the display device through a transfer process. However, if the LEDs are disposed through a transfer process, the process time increases and the process yield decreases.

In the display device 100 according to an exemplary embodiment of the present disclosure, the first conductive pattern 150 for self-alignment of the LED 140 is disposed on the bank 116 and used to dispose the LED 140 in the display device. Thus, in the display device 100 according to an exemplary embodiment of the present disclosure, the plurality of LEDs 140 may be more accurately and uniformly aligned. Therefore, an alignment defect may be minimized, and the reliability of the display device 100 may be improved. Also, in the display device 100 according to an exemplary embodiment of the present disclosure, the LED 140 is disposed by self-alignment. Thus, the process time and cost may be reduced.

Figure 4:
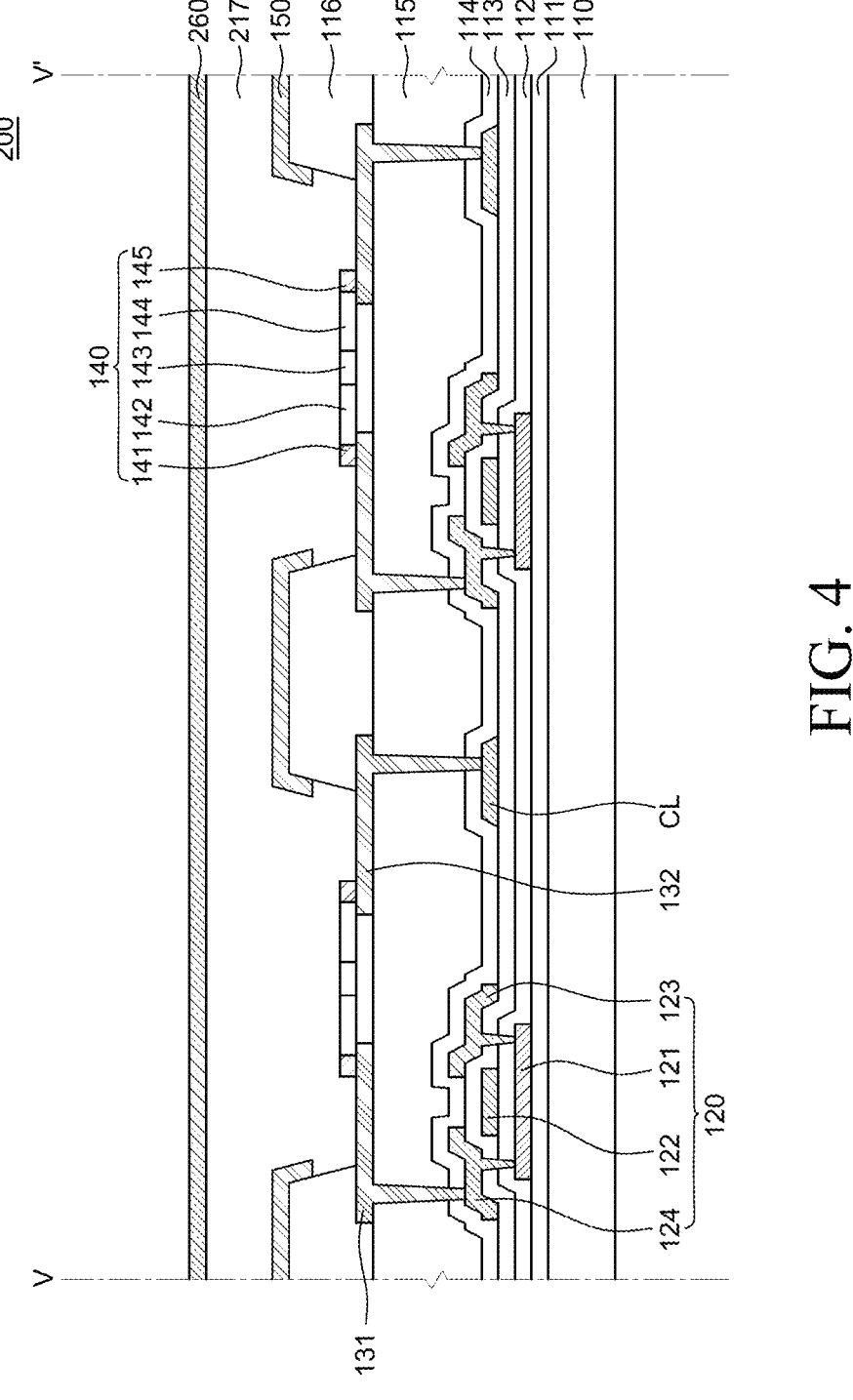
FIG. 4 is a cross-sectional view of a display device according to another exemplary embodiment of the present disclosure.
Figure 5:
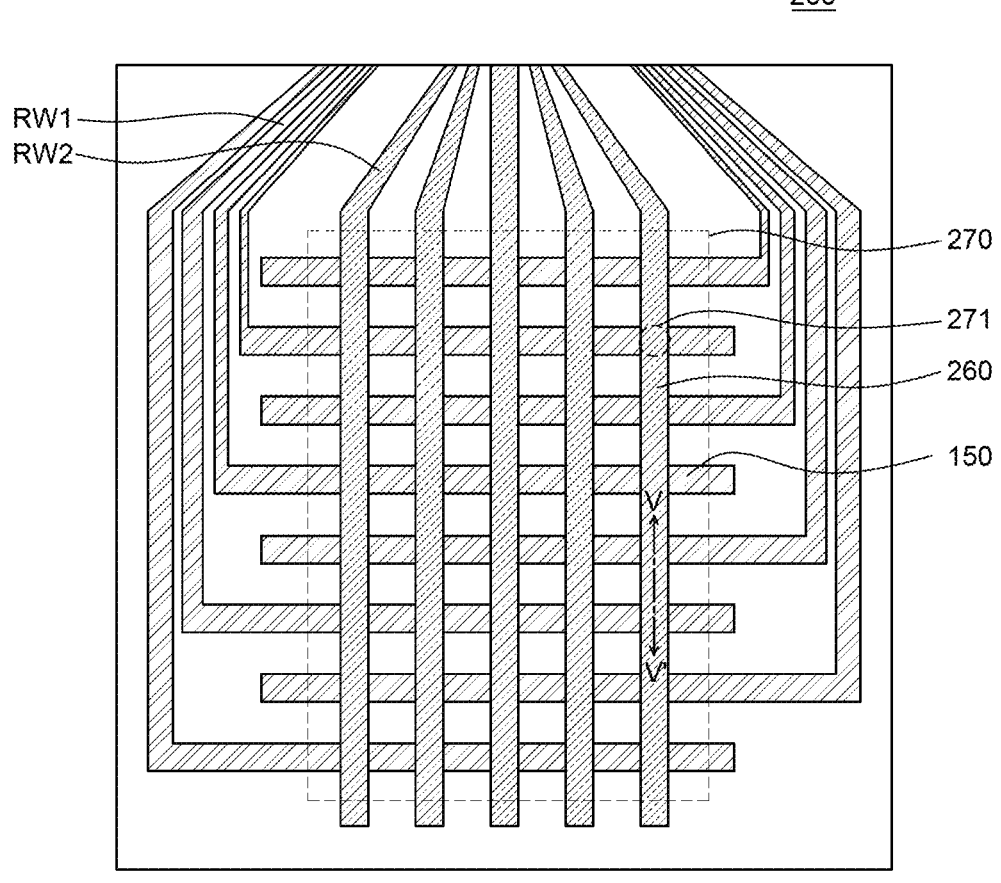
FIG. 5 is a plan view of the display device according to another exemplary embodiment of the present disclosure.

FIG. 4 is a cross-sectional view of a display device according to another exemplary embodiment of the present disclosure. FIG. 5 is a plan view of the display device according to another exemplary embodiment of the present disclosure. A display device 200 shown in FIG. 4 has substantially the same configuration as the display device 100 shown in FIG. 1 through FIG. 3 except that a plurality of second conductive patterns 260 is disposed to form a touch sensing part 270. Thus, a repeated description will be omitted.

Referring to FIG. 4, an insulating layer 217 is disposed on the bank 116, the plurality of first conductive patterns 150 and the plurality of LEDs 140. The insulating layer 217 may be a transparent insulating layer. For example, the insulating layer 217 may be made of an organic material. For example, the insulating layer 217 may be formed into, for example, a single-layered structure of polyimide or photo acryl or a multi-layered structure of polyimide and photo acryl, but is not limited thereto.

The plurality of second conductive patterns 260 is formed on the insulating layer 217. The plurality of second conductive patterns 260 is disposed in the second direction (Y-axis direction) intersecting with the first direction (X-axis direction) in which the plurality of first conductive patterns 150 is disposed. FIG. 4 illustrates that the first direction and the second direction are perpendicular to each other, but the present disclosure is not limited thereto.

The first conductive pattern 150 and the second conductive pattern 260 may be electrically disconnected from each other. Here, the first conductive pattern 150 and the second conductive pattern 260 being electrically disconnected from each other may be physically separated from each other and thus may not be electrically directly connected to each other. For example, the insulating layer 217 may be disposed between the first conductive pattern 150 and the second conductive pattern 260.

The plurality of second conductive patterns 260 may be made of the same material as the plurality of first conductive patterns 150. The plurality of second conductive patterns 260 may also be made of a different material from the plurality of first conductive patterns 150.

The plurality of first conductive patterns 150 and the plurality of second conductive patterns 260 may be touch electrodes and may serve as components of the touch sensing part 270. Here, the plurality of first conductive patterns 150 may be driving electrodes for applying a driving signal. Also, the plurality of second conductive patterns 260 may be sensing electrodes for sensing a change in mutual capacitance caused by a touch input based on the driving signal.

A sensing node 271 may be defined at an intersection between the first conductive pattern 150 and the second conductive pattern 260. An area where the sensing node 271 is defined is a minimum unit for sensing a touch input of a user. Here, each sensing node 271 may be defined for each sub-pixel SP. Alternatively, areas corresponding to several sub-pixels SP may be grouped in a block unit, and, thus, each sensing node 271 may be defined for the several sub-pixels SP.

Each sensing node 271 may have coordinate values. For example, the sensing nodes 271 may be formed in a matrix form corresponding to an orthogonal coordinate system and may have coordinate values corresponding thereto.

A touch sensor chip (not shown) may obtain a sensing signal from each sensing node 271 based on a change in mutual capacitance generated between the plurality of first conductive patterns 150 and the plurality of second conductive patterns 260. Also, the touch sensor chip (not shown) may calculate a touch position.

The touch sensor chip (not shown) may be disposed on a flexible printed circuit board (FPCB) or on a substrate in a chip-on-glass (COG) or chip-on-board (COB) manner and electrically connected to the first conductive pattern 150 and the second conductive pattern 260.

Meanwhile, as shown in FIG. 5, the display device 200 according to another exemplary embodiment of the present disclosure may further include a plurality of routing lines RW1 and RW2. The plurality of routing lines RW1 and RW2 is configured to electrically connect the plurality of first conductive patterns 150 and the plurality of second conductive patterns 260 to the touch sensor chip (not shown) Specifically, the plurality of routing lines RW1 and RW2 is formed outside the plurality of first conductive patterns 150 and the plurality of second conductive patterns 260. A plurality of first routing lines RW1 is electrically connected to one ends of the plurality of first conductive patterns 150 and a plurality of second routing lines RW2 is electrically connected to one ends of the plurality of second conductive patterns 260. The plurality of first routing lines RW1 and the plurality of second routing lines RW2 may connect the plurality of first conductive patterns 150 and the plurality of second conductive patterns 260 to the touch sensor chip (not shown).

Thus, in the display device 200 according to another exemplary embodiment of the present disclosure, the first conductive pattern 150 is used for self-alignment of the LED 140. Also, the second conductive pattern 260 is disposed so as to intersect with the first conductive pattern 150. Therefore, the first conductive pattern 150 and the second conductive pattern 260 may be used as touch electrodes. Accordingly, it is possible to implement a display device with the touch sensing part 270 built therein. Therefore, in the display device 200 according to another exemplary embodiment of the present disclosure, the first conductive pattern is used as a touch electrode of the touch sensing part without using a separate touch sensing part. Thus, it is possible to simplify a manufacturing process of the touch sensing part 270 and reduce cost for manufacturing the touch sensing part 270.

FIG. 6A through FIG. 6F are cross-sectional views for explaining a manufacturing method of the display device according to another exemplary embodiment of the present disclosure. Specifically, FIG. 6A through FIG. 6F are cross-sectional views for explaining a manufacturing method of the first electrode 131, the second electrode 132, the LED 140, the first conductive pattern 150 and the second conductive pattern 260 disposed on the planarization layer 115 of the display device 200 according to another exemplary embodiment of the present disclosure.

Figure 6A:
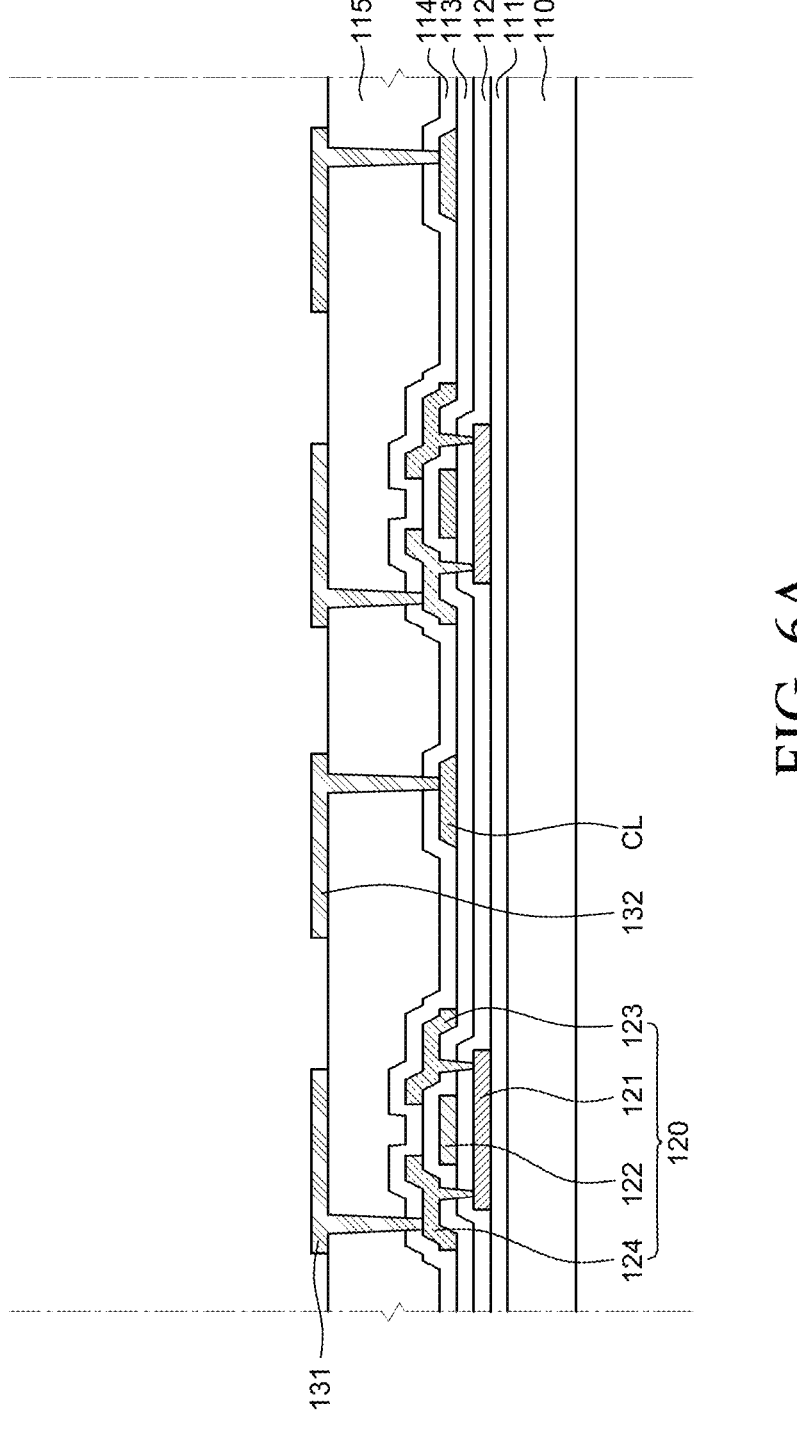
FIG. 6A through FIG. 6F are cross-sectional views for explaining a manufacturing method of the display device according to another exemplary embodiment of the present disclosure.

First, referring to FIG. 6A, the substrate 110 including a plurality of thin film transistors 120 disposed in a plurality of sub-pixels SP, respectively, is prepared. Then, the planarization layer 115 is formed on the plurality of thin film transistors 120. Thereafter, the first electrode 131 and the second electrode 132 is formed on the planarization layer 115 so as to be spaced apart from each other. For example, the first electrode 131 and the second electrode 132 may be formed at the same time through a photolithography process, but the present disclosure is not limited thereto.

Figure 6B:
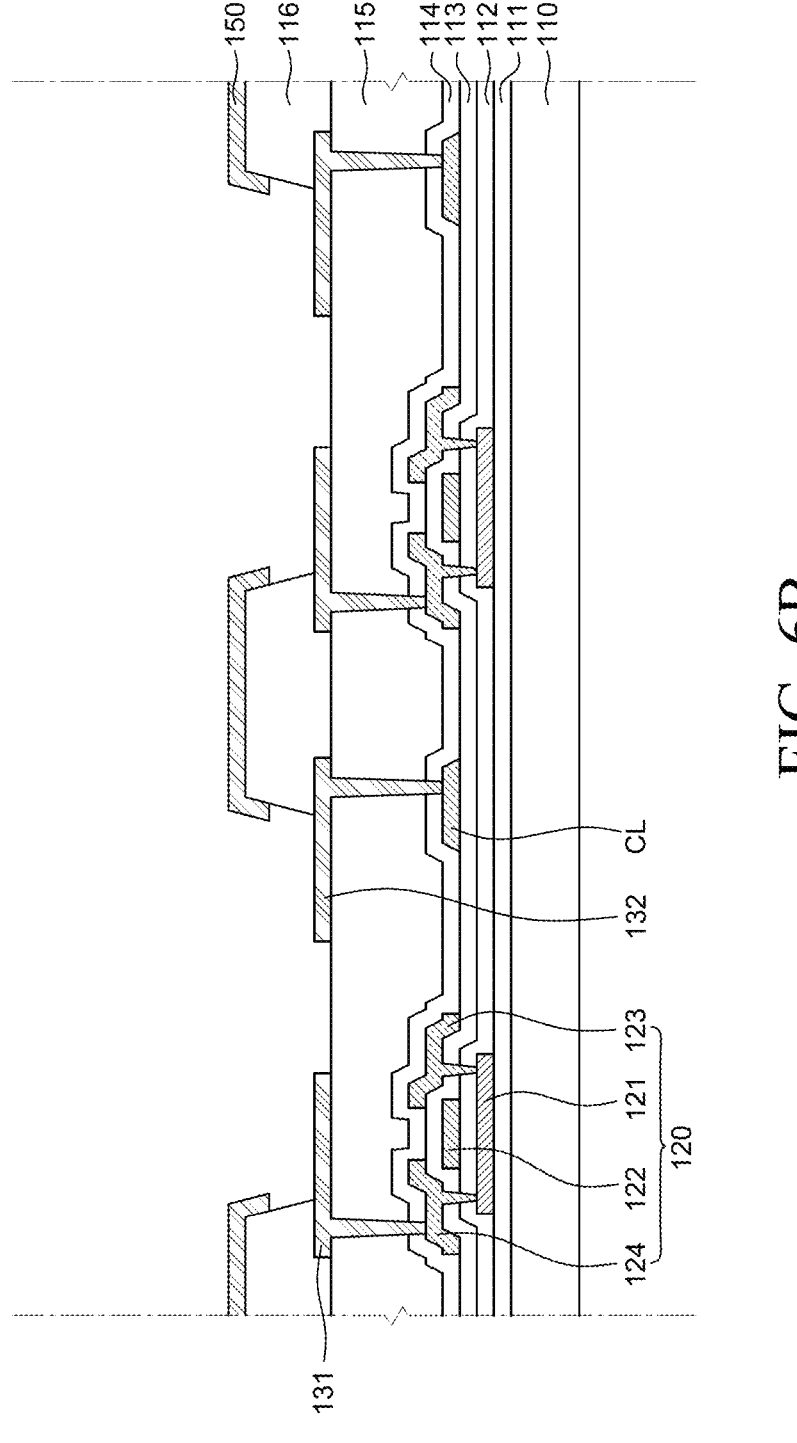

Then, referring to FIG. 6B, the bank 116 is formed on one end of the first electrode 131 and one end of the second electrode 132 on the planarization layer 115. The first conductive pattern 150 is formed on the bank 116. For example, the bank 116 and the first conductive pattern 150 may be formed through a photolithography process, but the present disclosure is not limited thereto.

Figure 6C:
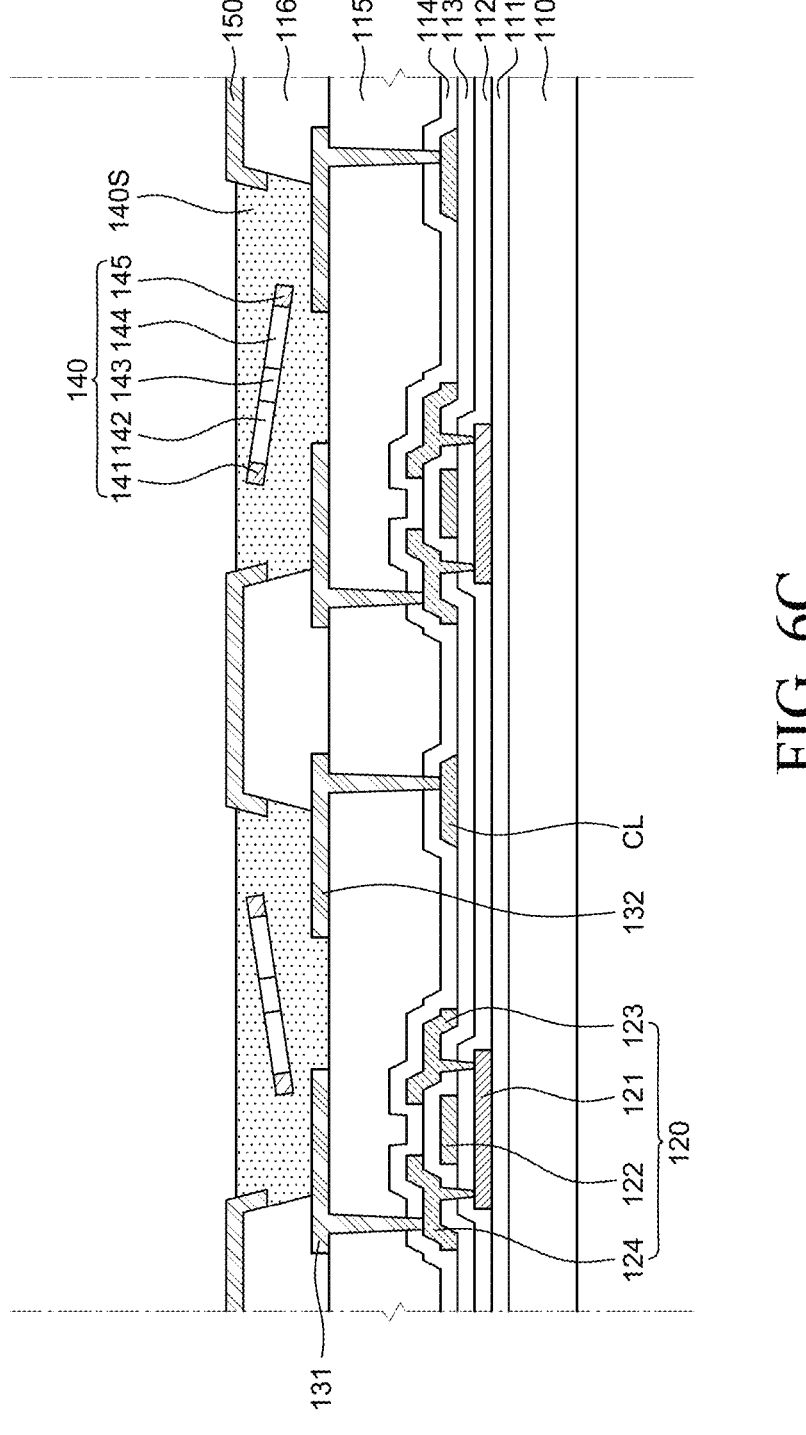

Then, referring to FIG. 6C, an LED solution 140S may be supplied into an area defined by the bank. Here, the LED solution 140S may be prepared by mixing the plurality of LEDs 140 with a solvent. The solvent may include any one of acetone, water, alcohol and toluene, but is not limited thereto.

Figure 6D:
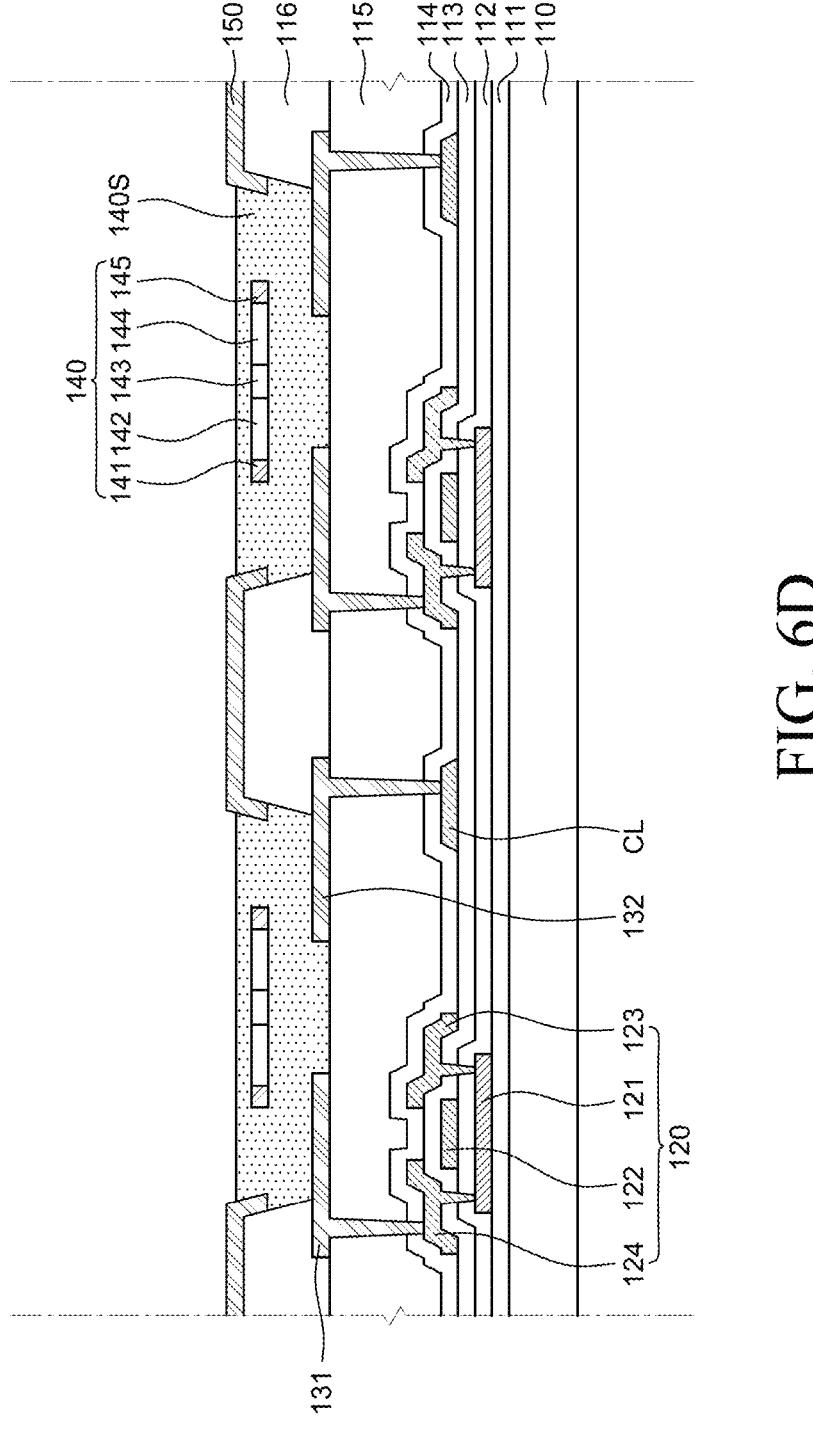

Thereafter, referring to FIG. 6D, each of the plurality of LEDs 140 is self-aligned between the first electrode 131 and the second electrode 132. The plurality of LEDs 140 includes a first LED that emits blue light, a second LED that emits green light and a third LED that emits red light. For example, the first LED may be disposed corresponding to the first sub-pixel. The second LED may be disposed corresponding to the second sub-pixel. The third LED may be disposed corresponding to the third sub-pixel.

The self-alignment of the LED 140 may include self-alignment of the first LED 140, self-alignment of the second LED 140 and self-alignment of the third LED 140.

After the LED solution 140S is supplied, different voltages are respectively applied to odd-numbered first conductive patterns 150 and even-numbered first conductive patterns 150 of the plurality of first conductive patterns 150. For example, a positive (+) voltage may be applied to the odd-numbered first conductive patterns 150, whereas a negative (−) voltage may be applied to the even-numbered first conductive patterns 150, but the present disclosure is not limited thereto. When the voltages are applied to the plurality of first conductive patterns 150, the first device electrode 141 of the first LED 140 may be aligned toward the first electrode 131 and the second device electrode 145 may be aligned toward the second electrode 132. That is, when a voltage is applied to the first electrode 131 and the second electrode 132, the first LED 140 may be easily self-aligned.

Then, the process performed to the first sub-pixel is also performed to an area corresponding to the second sub-pixel and an area corresponding to the third sub-pixel. Thus, the LED 140 may be self-aligned in each of the plurality of sub-pixels SP.

Figure 6E:
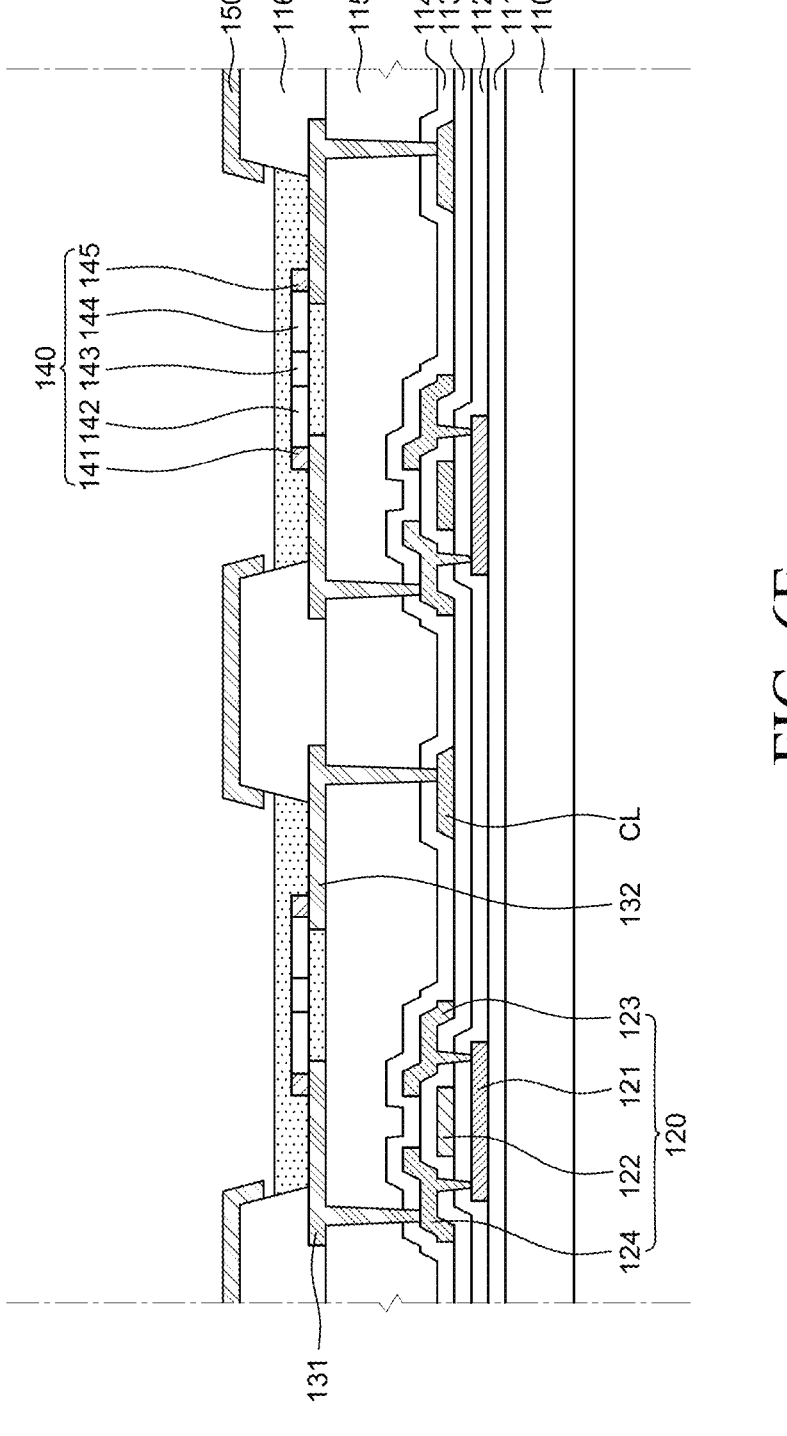

Then, referring to FIG. 6E, the plurality of LEDs 140 is connected to the plurality of first electrodes 131 and the plurality of second electrodes 132. Specifically, if the solvent is dried in a state where the voltages are applied to the first conductive patterns 150, the plurality of LEDs 140 may sink down toward the first electrode 131 and the second electrode 132. Thus, the plurality of LEDs 140 may be connected to the first electrode 131 and the second electrode 132.

Figure 6F:
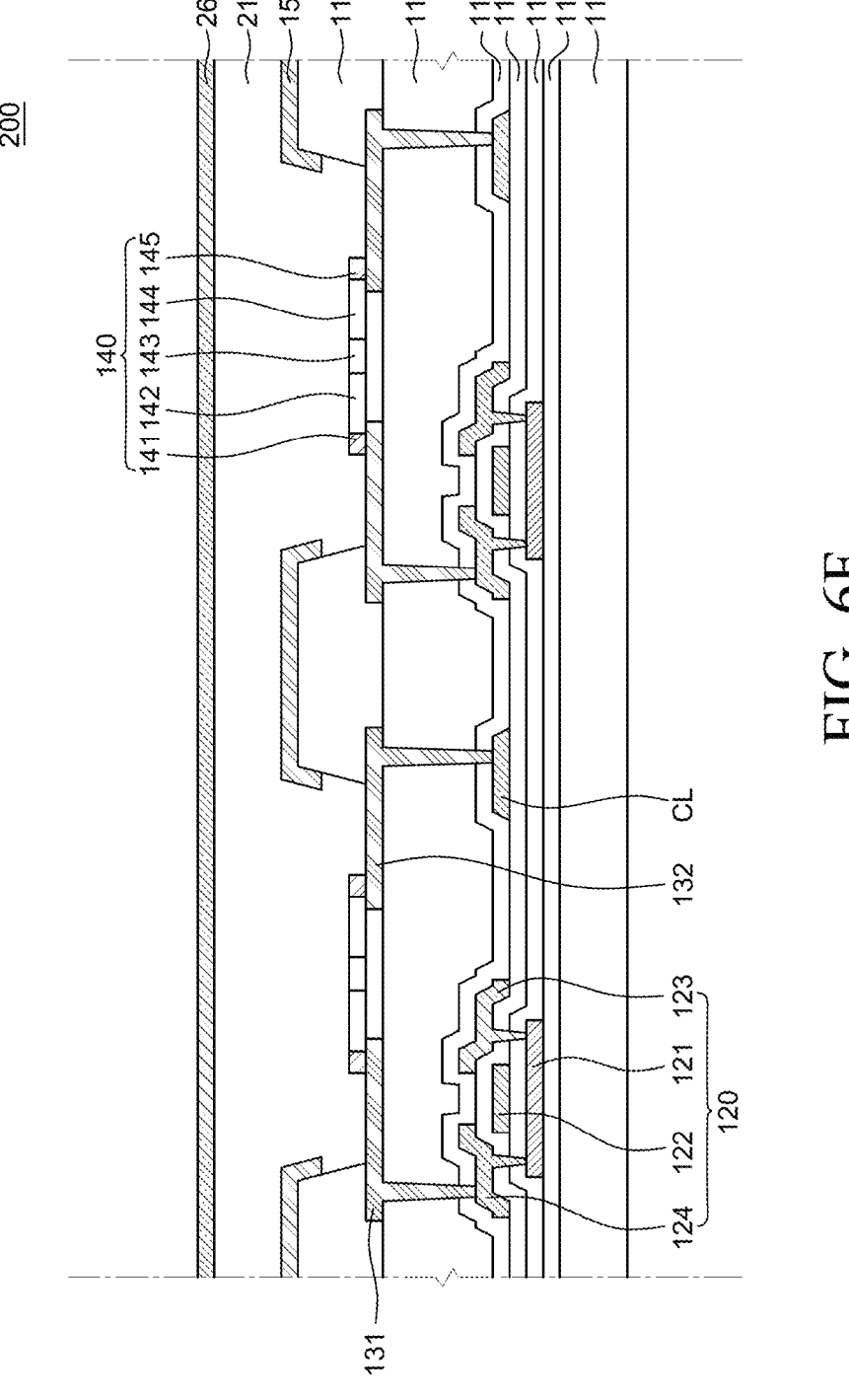

Referring to FIG. 6F, the plurality of second conductive patterns 260 intersecting with the plurality of first conductive patterns 150 is formed to form the touch sensing part 270.

First, the insulating layer 217 is formed on the plurality of first conductive patterns 150 and the plurality of LEDs 140. Then, the plurality of second conductive patterns 260 is formed on the insulating layer 217 so as to intersect with the plurality of first conductive patterns 150. The second conductive pattern 260 may be formed in the same manner as the first conductive pattern 150. Accordingly, the sensing node 271 is formed at an intersection between the first conductive pattern 150 and the second conductive pattern 260. Also, the touch sensing part 270 formed by the plurality of first conductive patterns 150 and the plurality of second conductive patterns 260 that define the plurality of sensing nodes 271 receives a touch input.

As for a typical display device including LEDs, a red LED, a green LED and a blue LED are directly transferred to areas corresponding to a red sub-pixel, a green sub-pixel and a blue sub-pixel, respectively. Thus, the process time and cost increase and the process yield decreases.

However, in the manufacturing method of the display device 200 according to another exemplary embodiment of the present disclosure, the plurality of first conductive patterns 150 for self-alignment of the plurality of LEDs 140 may be disposed on the planarization layer 115. That is, a solution containing the LED 140 is supplied between two banks 116 adjacent to each other and voltages are applied to the first conductive patterns 150. Thus, the plurality of LEDs 140 may be self-aligned. In other words, in each of the plurality of LEDs 140, the first device electrode 141 may be aligned toward the first electrode 131 and the second device electrode 145 may be aligned toward the second electrode 132. Therefore, the plurality of LEDs 140 may be easily disposed in the plurality of sub-pixels SP.

Also, self-alignment of the plurality of LEDs 140 may be performed in the respective sub-pixels SP at the same time. Specifically, when the first LED 140 is self-aligned, the entire area corresponding to the first sub-pixel may be opened and the process may be performed. Therefore, self-alignment of a plurality of first LEDs 140 may be performed in all of a plurality of first sub-pixels at the same time. Also, self-alignment of a plurality of second LEDs 140 may be performed in all of a plurality of second sub-pixels at the same time. Further, self-alignment of a plurality of third LEDs 140 may be performed in all of a plurality of third sub-pixels at the same time. In other words, self-alignment of the LED 140 may be performed once in each of the plurality of sub-pixels SP. Thus, there is no need to transfer each LED 140, which makes it possible to simplify the process. Therefore, the process time and cost may be reduced, and the process yield may be improved.

Also, the second conductive pattern 260 may be further disposed so as to intersect with the first conductive pattern 150, and the first conductive pattern 150 and the second conductive pattern 260 may be used as touch electrodes. Accordingly, it is possible to implement a display device with the touch sensing part 270 built therein.

The exemplary embodiments of the present disclosure can also be described as follows.

According to an aspect of the present disclosure, a display device includes a substrate including a plurality of sub-pixels, a plurality of thin film transistors disposed on the substrate, a planarization layer disposed on the plurality of thin film transistors, a plurality of first electrodes disposed on the planarization layer and electrically connected to the plurality of thin film transistors, a plurality of second electrodes disposed on the planarization layer and spaced apart from the plurality of first electrodes, a bank covering a part of each of the plurality of first electrodes and the plurality of second electrodes and disposed to define an emission area, a plurality of LEDs disposed in the emission area and electrically connected to the plurality of first electrodes and the plurality of second electrodes, and a plurality of first conductive patterns disposed on the bank.

The plurality of first conductive patterns may be disposed on the bank so as to be extended in a first direction.

The display device may further include an insulating layer disposed on the bank, the plurality of first conductive patterns and the plurality of LEDs, and a plurality of second conductive patterns disposed on the insulating layer in a second direction so as to intersect with the plurality of first conductive patterns.

The display device may further include a touch sensing part in which the plurality of first conductive patterns and the plurality of second conductive patterns are used as touch electrodes.

The touch sensing part may further include a plurality of first routing lines electrically connected to one ends of the plurality of first conductive patterns, and a plurality of second routing lines electrically connected to one ends of the plurality of second conductive patterns.

The LED may be a light emitting nanorod.

According to another aspect of the present disclosure, a manufacturing method of a display device includes a process of preparing a substrate including a plurality of thin film transistors disposed in a plurality of sub-pixels, respectively, a process of forming a planarization layer on the plurality of thin film transistors, a process of preparing a plurality of first electrodes and a plurality of second electrodes spaced apart from each other on the planarization layer, a process of preparing a bank covering a part of each of the plurality of first electrodes and the plurality of second electrodes and disposed to define an emission area, a process of preparing a plurality of first conductive patterns on the bank and a process of facilitating self-alignment of a plurality of LEDs by applying a voltage to the plurality of first conductive patterns.

The process of facilitating self-alignment of the plurality of LEDs may include a process of supplying a solvent and the plurality of LEDs into a space defined by the bank.

The process of facilitating self-alignment of the plurality of LEDs further may include a process of respectively applying different voltages to odd-numbered first conductive patterns and even-numbered first conductive patterns of the plurality of first conductive patterns.

The process of facilitating self-alignment of the plurality of LEDs may further include a process of connecting the plurality of LEDs to the plurality of first electrodes and the plurality of second electrodes by drying the solvent in a state where the voltages are applied.

The manufacturing method of a display device may further include a process of preparing a touch sensing part, and the process of preparing the touch sensing part may include a process of preparing an insulating layer on the bank, the plurality of first conductive patterns and the plurality of LEDs, and a process of preparing a plurality of second conductive patterns on the insulating layer so as to intersect with the plurality of first conductive patterns, and the touch sensing part includes the plurality of first conductive patterns and the plurality of second conductive patterns.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The invention claimed is:

1. A display device, comprising:
a substrate including a plurality of sub-pixels;
a plurality of thin film transistors disposed on the substrate;
a planarization layer disposed on the plurality of thin film transistors;
a plurality of first electrodes disposed on the planarization layer and electrically connected to the plurality of thin film transistors;
a plurality of second electrodes disposed on the planarization layer and spaced apart from the plurality of first electrodes;
a bank covering a part of each of the plurality of first electrodes and the plurality of second electrodes and disposed to define an emission area;
a plurality of LEDs disposed in the emission area and electrically connected to the plurality of first electrodes and the plurality of second electrodes; and
a plurality of first conductive patterns disposed on the bank,
wherein the plurality of first conductive patterns are electrically insulated from the plurality of LEDs.

2. The display device according to claim 1, wherein the plurality of first conductive patterns are disposed on the bank so as to be extended in a first direction.

3. The display device according to claim 2, further comprising:
an insulating layer disposed on the bank, the plurality of first conductive patterns and the plurality of LEDs; and
a plurality of second conductive patterns disposed on the insulating layer in a second direction so as to intersect with the plurality of first conductive patterns.

4. The display device according to claim 3, further comprising:
a touch sensing part in which the plurality of first conductive patterns and the plurality of second conductive patterns are used as touch electrodes.

5. The display device according to claim 4, wherein the touch sensing part further includes:
a plurality of first routing lines electrically connected to one ends of the plurality of first conductive patterns; and
a plurality of second routing lines electrically connected to one ends of the plurality of second conductive patterns.

6. The display device according to claim 1, wherein each of the plurality of LEDs is a light emitting nanorod.

7. A manufacturing method of a display device, comprising:
a process of preparing a substrate including a plurality of thin film transistors disposed in a plurality of sub-pixels, respectively;
a process of forming a planarization layer on the plurality of thin film transistors;
a process of preparing a plurality of first electrodes and a plurality of second electrodes spaced apart from each other on the planarization layer;
a process of preparing a bank covering a part of each of the plurality of first electrodes and the plurality of second electrodes and disposed to define an emission area;
a process of preparing a plurality of first conductive patterns on the bank; and
a process of facilitating self-alignment of a plurality of LEDs by applying a voltage to the plurality of first conductive patterns,
wherein the plurality of first conductive patterns are electrically insulated from the plurality of LEDs.

8. The manufacturing method of a display device according to claim 7, wherein the process of facilitating self-alignment of the plurality of LEDs includes a process of supplying a solvent and the plurality of LEDs into a space defined by the bank.

9. The manufacturing method of a display device according to claim 8, wherein the process of facilitating self-alignment of the plurality of LEDs further includes a process of respectively applying different voltages to odd-numbered first conductive patterns and even-numbered first conductive patterns of the plurality of first conductive patterns.

10. The manufacturing method of a display device according to claim 9, wherein the process of facilitating self-alignment of the plurality of LEDs further includes a process of connecting the plurality of LEDs to the plurality of first electrodes and the plurality of second electrodes by drying the solvent in a state where the voltages are applied.

11. The manufacturing method of a display device according to claim 7, further comprising:
a process of preparing a touch sensing part,
wherein the process of preparing the touch sensing part includes:
a process of preparing an insulating layer on the bank, the plurality of first conductive patterns and the plurality of LEDs; and
a process of preparing a plurality of second conductive patterns on the insulating layer so as to intersect with the plurality of first conductive patterns, and
wherein the touch sensing part includes the plurality of first conductive patterns and the plurality of second conductive patterns.

* * * * *